United States Patent
Hanna et al.

(10) Patent No.: US 7,259,390 B2
(45) Date of Patent: Aug. 21, 2007

(54) ORGANIC SEMICONDUCTOR MATERIAL

(75) Inventors: Jun-Ichi Hanna, Yokohama (JP); Hiroaki Iino, Abiko (JP); Hiroki Maeda, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/787,895

(22) Filed: Feb. 26, 2004

(65) Prior Publication Data
US 2004/0245497 A1 Dec. 9, 2004

(30) Foreign Application Priority Data
Feb. 27, 2003 (JP) ............... 2003-052068

(51) Int. Cl.
 H01L 29/08 (2006.01)
 H01L 29/12 (2006.01)
 H01L 35/24 (2006.01)
(52) U.S. Cl. ......... 257/40; 257/E51.047; 257/E51.049; 438/99
(58) Field of Classification Search ........... 252/299.01, 252/299.3, 500; 257/40, E51.047, E51.049; 438/99
See application file for complete search history.

(56) References Cited

U.S. PATENT DOCUMENTS

| | | | | |
|---|---|---|---|---|
| 4,334,734 A | * | 6/1982 | Hareng et al. | 349/2 |
| 4,448,491 A | * | 5/1984 | Okubo | 349/155 |
| 4,602,422 A | * | 7/1986 | Dinh | 438/88 |
| 6,224,787 B1 | * | 5/2001 | Hanna et al. | 252/299.3 |
| 6,326,640 B1 | * | 12/2001 | Shi et al. | 257/40 |

(Continued)

FOREIGN PATENT DOCUMENTS

JP 08-181364 * 7/1996

(Continued)

OTHER PUBLICATIONS

English translation by computer for JP 08-181364, http://www4.ipdl.ncipi.go.jp/Tokujitu/PAJdetail.ipdl?N0000=60&N0120=01&N2001=2&N3001=H08-181364.*

(Continued)

Primary Examiner—Shean C Wu
(74) Attorney, Agent, or Firm—Harness, Dickey & Pierce P.L.C.

(57) ABSTRACT

There is provided a liquid crystalline material, suitable for use as an organic semiconductor material, in which, even when the charge transport distance is long, the charge transport capability is satisfactory, the charge mobility is high, and the dependence of the charge transport properties upon field strength is small. The organic semiconductor material having rodlike low-molecular weight liquid crystallinity comprises: a core structure comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6; and a terminal structure attached to at least one end of the core structure, the terminal structure being capable of developing liquid crystallinity.

1 Claim, 3 Drawing Sheets

U.S. PATENT DOCUMENTS 7,102,154 B2 * 9/2006 Hanna et al. .................. 257/40

FOREIGN PATENT DOCUMENTS

| JP | 2001-33990 | * | 2/2001 |
| JP | 2001-75297 | * | 3/2001 |

OTHER PUBLICATIONS

English translation by computer for JP 2001-33990, http://www4.ipdl.ncipi.go.jp/Tokujitu/PAJdetail.ipdl?N0000=60&N0120=01&N2001=2&N3001=2001-033990.*

English translation by computer for JP 2001-75297, http://www4.ipdl.ncipi.go.jp/Tokujitu/PAJdetail.ipdl?N0000=60&N0120=01&N2001=2&N3001=2001-075297.*

* cited by examiner

ORGANIC SEMICONDUCTOR MATERIAL

BACKGROUND OF THE INVENTION

1. Field of the Invention

The present invention relates to an organic semiconductor material having rodlike low-molecular weight liquid crystallinity with unique charge transfer characteristics.

2. Background Art

In 1993, triphenylene derivatives among representative materials of discotic liquid crystals have been found to have a high-speed charge transport capability which is $10^3$ to $10^4$ times higher than the charge transport speed of amorphous organic semiconductors which have been put to practical use in, for example, photoconductor drums for electrophotography and organic EL devices. Further, two years after the finding, rodlike smectic liquid crystals, which have been considered as an ion conductor up to that time, have also been found to have high-speed electron conductivity which is superior to the charge transport capability of the triphenylene derivatives. The above finding has led to gradual recognition that liquid crystalline materials are to be placed as new high-quality organic semiconductor materials having spontaneous molecular orientation capability.

It has been observed that these liquid crystalline materials have a mobility of more than $10^{-2}$ cm$^2$/Vs which is very large as an organic material although the mobility is still about one order of magnitude smaller than that of crystalline materials. Further, it has been clarified that the behavior of these liquid crystalline materials is different from that of conventional solid materials, for example, in that, unlike conventional amorphous materials, the mobility does not depend upon the temperature and the electric field and in that, in a polydomain structure (corresponding to "polycrystal" in the crystal), unlike polycrystalline materials, domain interfaces are electrically inert.

The properties of these liquid crystalline materials are considered attributable to molecular orientation similar to that of crystals and fluidity similar to that of liquids, which are characteristic of liquid crystalline materials. By virtue of these properties unique to the liquid crystalline materials, the liquid crystalline materials are expected to be applied to various applications which include, for example, thin-film transistors (known also as "organic TFT") utilizing a liquid crystalline material as an organic semiconductor material, luminescent elements, and solar batteries. For example, Japanese Patent Laid-Open No. 312711/1998 discloses a liquid crystalline organic semiconductor material having a high level of charge mobility.

SUMMARY OF THE INVENTION

The present inventors have now found that rodlike low-molecular weight liquid crystals having a predetermined structure are advantageous in that, even when the charge transport distance is long, the charge transport capability is satisfactory, the charge mobility is high, and the dependence of the charge transport properties upon electric field strength is small and that the use of such liquid crystalline materials can realize an organic semiconductor structure having a satisfactory function without the need to form a fine structure which cannot be formed by conventional printing-related techniques without difficulties. The present invention has been made based on such finding.

Accordingly, an object of the present invention is to provide a liquid crystalline material, suitable for use as an organic semiconductor material, in which, even when the charge transport distance is long, the charge transport capability is satisfactory, the charge mobility is high, and the dependence of the charge transport properties upon field strength is small, particularly to provide an organic semiconductor material having a characteristic charge lifetime as evaluated by a time-of-flight (hereinafter referred to as "TOF") method.

The organic semiconductor material according to the present invention is an organic semiconductor material having rodlike low-molecular weight liquid crystallinity, comprising: a core structure comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6; and a terminal structure attached to at least one end of said core structure, said terminal structure being capable of developing liquid crystallinity, said organic semiconductor material having an electron lifetime of at least $4\times10^{-5}$ sec and/or a hole lifetime of at least $1\times10^{-5}$ sec as measured in a cell structure form prepared by holding the organic semiconductor material between opposed electrodes.

In a preferred embodiment of the present invention, the terminal structure capable of developing liquid crystallinity is attached to both ends of the core structure.

According to the present invention, transient photocurrent measurements by the TOF method show that the hole lifetime is governed by recombination and the recombination lifetime is about $10^{-2}$ sec and that the electron lifetime is governed by trapping by impurity molecules and the trapping lifetime is about $4\times10^{-5}$ sec. Accordingly, such organic semiconductor materials having very long hole lifetime and electron lifetime and a high level of charge mobility can allow a satisfactory quantity of charge to be traveled through the organic semiconductor structure even when the field strength is a few orders of magnitude lower than that of the material used in the conventional organic semiconductor structure.

In particular, in the organic semiconductor material according to the present invention, in such a state that the material exhibits a SmB phase, transit can be observed even in a cell with a large thickness of not less than 700 μm. Further, in such a state that the material exhibits a SmA phase, transit can be observed even in a cell with a large thickness of not less than 500 μm.

The organic semiconductor material according to the present invention having the above features can realize the transport of a satisfactory quantity of charges even in the case where, in the organic semiconductor structure, the charge transport distance (transport length) is long, or the thickness of layers constituting the organic semiconductor structure is large. Further, since the charge mobility is high and the dependence of charge transport properties upon field strength is small, an organic semiconductor structure having a satisfactory function can be realized without the need to form a fine structure which cannot be formed by conventional printing-related techniques without difficulties.

DETAILED DESCRIPTION OF THE INVENTION

Figure 1:
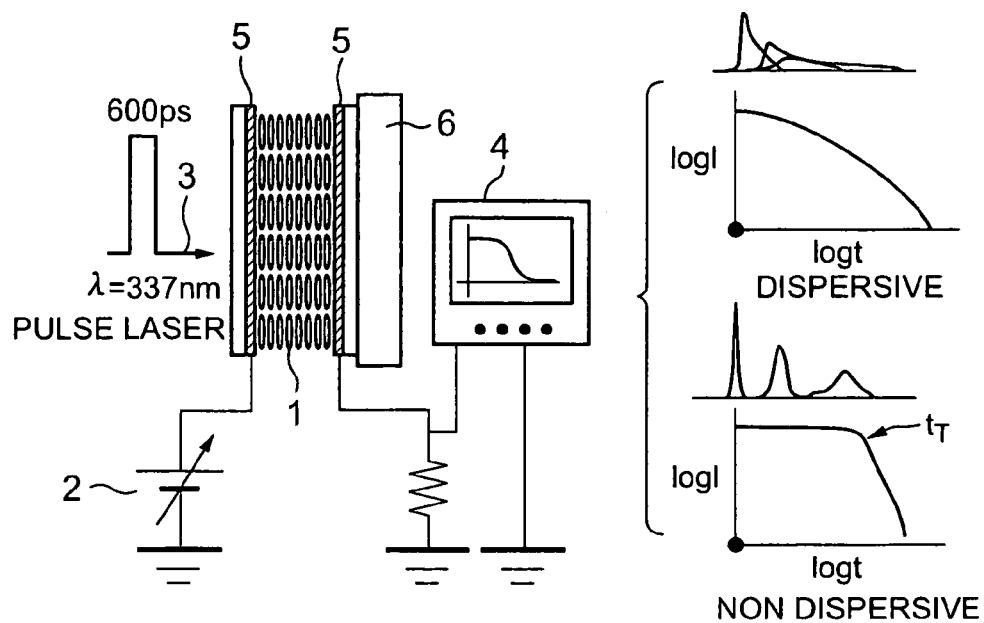
FIG. 1 is a diagram showing an example of the construction of a transient photocurrent measuring method.

The organic semiconductor material according to the present invention will be described with reference to the accompanying drawings.

The organic semiconductor material according to the present invention is a rodlike low-molecular weight liquid crystal material, and the core structure thereof comprises: a core structure comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6; and a terminal structure (hereinafter often referred to as "terminal group") attached to at least one end of said core structure, said terminal structure being capable of developing liquid crystallinity. Preferably, the terminal structure is attached to both the ends of the core structure.

6 π aromatic electron rings constituting the core structure include, for example, benzene, furan, thiophene, pyrrole, 2H-pyran, 4H-thiopyran, pyridine, oxazole, isoxazole, thiazole, isothiazole, furazane, imidazole, pyrazole, pyrazine, pyrimidine, and pyridazine rings. 8 π electron rings include, for example, pentalene, indene, indolizine, and 4H-quinolizine rings. 10 π electron rings include, for example, naphthalene, azulene, benzofuran, isobenzofuran, 1-benzothiophene, 2-benzothiophene, indole, isoindole, 2H-chromene, 1H-2-benzopyran, quinoline, isoquinoline, 1,8-naphthyridine, benzimidazole, 1H-indazole, benzoxazole, benzothiazole, quinoxaline, quinazoline, cinnoline, pteridine, purine, and phthalazine rings. 12 π electron rings include, for example, heptalene, biphenylene, as-indacene, s-indacene, acenaphthylene, fluorene, and phenalene rings. 14 π electron rings include, for example, phenanthrene, anthracene, carbazole, xanthene, acridine, phenanthridine, perimidine, 1,10-phenanthroline, phenazine, phenarsazine, and tetrathiafulvalene rings. 16 π electron rings include, for example, fluoranthene, acephenanthrylene, aceanthrylene, pyrene, thianthrene, phenoxathiine, phenoxazine, and phenothiazine rings. 18 π electron rings include, for example, triphenylene, chrysene, naphthacene, and pleiadene rings. 20 π electron rings include, for example, perylene ring. 22 π electron rings include, for example, picene, pentaphene, and pentacene rings. 24 π electron rings include, for example, tetraphenylene and coronene rings. 26 π electron rings include, for example, hexaphene, hexacene, and rubicene rings.

Some of the compounds having the above core structure may be those described in Japanese Patent Laid-Open No. 312711/1998.

A specific example of the terminal structure is one in which the above-described rigid core structure has on its one end any one of H (a hydrogen atom), a halogen atom, a cyano group, a nitro group, a hydroxyl group and the like and on its other end a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

Further, the terminal structure may be such that the core structure has on its both ends a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

Among the organic semiconductor materials having the above core structure and terminal structure, the organic semiconductor material according to the present invention has an electron lifetime of at least $4 \times 10^{-5}$ sec and/or a hole lifetime of at least $1 \times 10^{-5}$ sec as measured in a cell structure form prepared by holding the organic semiconductor material between opposed electrodes. When electron transport and hole transport are present together, the electron lifetime and the hole lifetime are preferably at least $4 \times 10^{-5}$ sec and at least $1 \times 10^{-5}$ sec, respectively.

The electron lifetime and the hole lifetime are evaluated by a transient photocurrent measuring method (time-of-flight method; TOF method) shown in FIG. 1.

At the outset, a liquid crystalline organic semiconductor material 1 is poured into a cell having a sandwich structure provided with an electrode 5 on its both sides to form a cell structure. Alternatively, a thin film is formed by spin coating, casting, dipping or the like, and electrodes 5 are provided on both sides of the thin film to form a cell structure. Next, as shown in FIG. 1, a direct voltage 2 is applied to the cell structure, and, at time 0, optical pulses 3 of, e.g., 337 nm·600 ps, are applied to a portion around one of the electrodes. In order to maintain the organic semiconductor material in the cell at a predetermined temperature, a hot stage 6 may be provided on one electrode side. Upon the light irradiation, carriers are generated in a sheet form around the electrode. A displacement current upon the travel of the carrier to the counter electrode is displayed on an oscilloscope 4 to measure a carrier transit time based on which the mobility is determined.

According to the above method, since the sign of carrier traveled can be changed depending upon the direction of electric field, the type of carrier (positive: hole, negative: electron) can be specified.

A specific example of evaluation of the carrier lifetime (that is, electron lifetime and hole lifetime) by the TOF method will be described.

The quantity of charge (quantity of collected charge) arrived at the counter electrode can be determined by integration of transient photocurrent waveform, obtained by the TOF method, with respect to time. In a solid material such as an amorphous material, carriers trapped in a deep level generally stay as space charge in the material. This requires a long relaxation time corresponding to the depth of the trap, and, thus, the carriers trapped in the impurity are not included in the collected charges. In flowable material systems like liquid crystalline organic semiconductor materials according to the present invention, however, the trapped carriers also contribute through ion conduction to the transient photocurrent. Therefore, in the liquid crystalline organic semiconductor material according to the present invention, this contribution can be estimated based on the waveform obtained by the TOF method.

Figure 2:
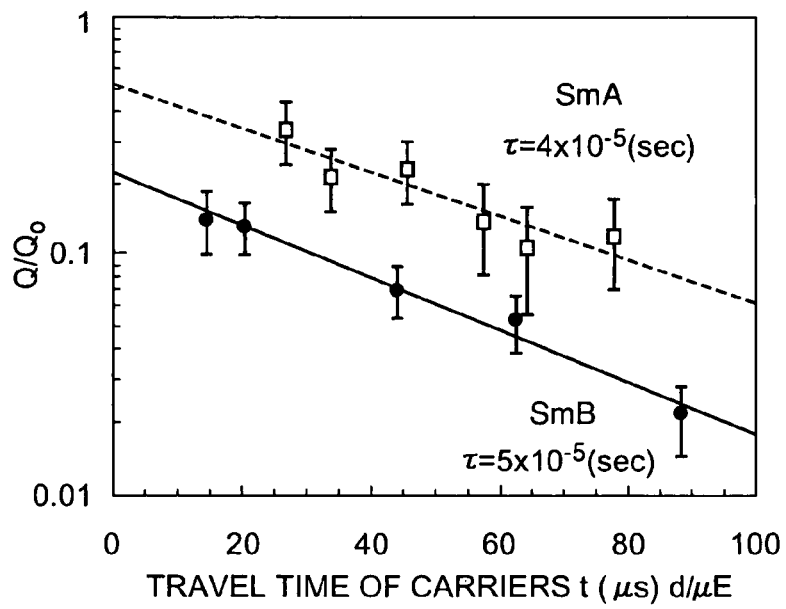
FIG. 2 is a graph showing an example of the proportion of the quantity of collected charges Q in electron conduction to the whole quantity of collected charges $Q_0$ in the organic semiconductor material according to the present invention plotted against the time of electron traveled through cells with varied thicknesses.

FIG. 2 is a graph showing an example of the proportion of the quantity of collected charges Q in electron conduction to the whole quantity of collected charges $Q_0$ plotted against the time of electron traveled through cells with varied thicknesses, in the case where a 2-phenylnaphthalene derivative represented by formula (I) below (6-(4'-octylphenyl)-2-dodecyloxynaphthalene; hereinafter referred to as "8-PNP-012") was used as a liquid crystalline organic semiconductor material. In this graph, d/µE is transit time of carriers, and the electric field applied is $8 \times 10^4$ V/cm. The whole quantity of collected charges, $Q_0$, is a value obtained by integration of transient photocurrent waveform, obtained by the TOF method, with respect to time, and the quantity of collected charges in electron conduction, Q, is the quantity of charges in an electron conduction part determined by subtracting the quantity of charges in an ion conduction part from the whole quantity of collected charges, $Q_0$.

Figure 3:
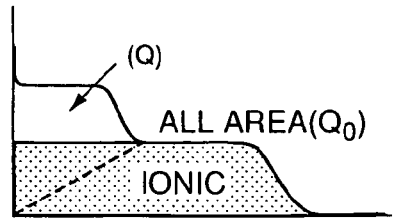
FIG. 3 is a typical diagram showing the contribution of electron conduction to a transient photocurrent.

As shown in FIG. 3, this graph can be prepared by determining the contribution of electron conduction to transient photocurrent.

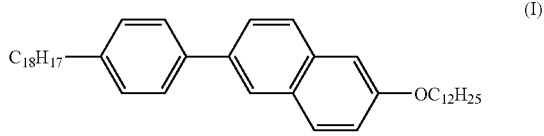

(I)

In the present invention, as shown in FIG. 2, it has been found that the $Q/Q_0$ value decreases exponentially with increasing the transit time of electrons. The property time can be estimated from the slope of the $Q/Q_0$. When the above compound was used, the property time was $4 \times 10^{-5}$ sec for a smectic A phase (SmA phase) and was $5 \times 10^{-5}$ sec for a smectic B phase (SmB phase). These values correspond to the trapping lifetime of electrons in respective phases.

Figure 4:
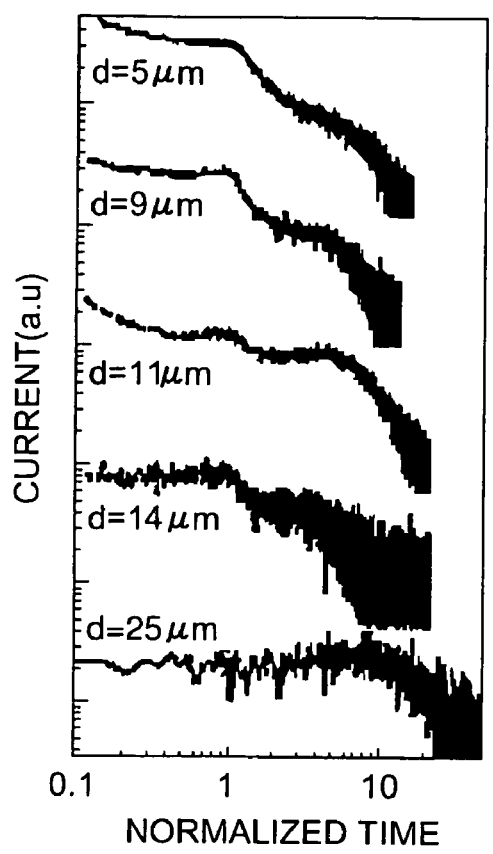
FIG. 4 is a graph showing an example of the results of measurement of negative-charge transient photocurrent waves as a function of the cell thickness under given field strength (results of SmA phase at 110° C.)
Figure 5:
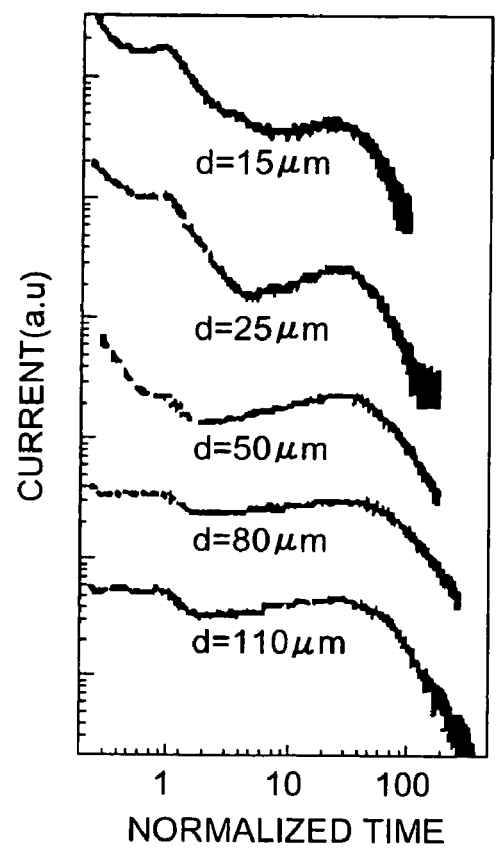
FIG. 5 is a graph showing an example of the results of measurement of negative-charge transient photocurrent waves as a function of the cell thickness under given field strength (results of SmB phase at 90° C.)

The reason for this is as follows. FIGS. 4 and 5 are each a graph showing an example of the results of measurement of negative-charge transient photocurrent waves as a function of the cell spacing (referred to also as "cell thickness") under given field strength, in the case where 8-PNP-012 represented by formula (I) was used. In FIGS. 4 and 5, the field strength is $8 \times 10^4$ V/cm. FIG. 4 shows the results of a SmA phase at 110° C., and FIG. 5 shows the results of a SmB phase at 90° C. In the present invention, it was found that, as shown in FIGS. 4 and 5, in the measurement of negative-charge transient photocurrent waves, varying the cell thickness under given field strength causes a change in the proportion of the contribution of the electron conduction and the ion conduction to the current in each time domain.

Specifically, when the cell thickness is small, a major proportion of the contribution is accounted for by the contribution of electron conduction. The contribution of ion conduction increases with increasing the cell thickness. This is considered attributable to the fact that a very small amount of impurities, which cannot be removed by recrystallization, are homogeneously present as a trap in the bulk and trap electrons produced upon light irradiation to produce ionized impurity molecules which then migrate as ions. Accordingly, it is considered that, as the cell thickness increases, the contribution of the conduction of ions trapped by the impurities before arrival of a major part of electrons at the counter electrode increases.

Figure 6:
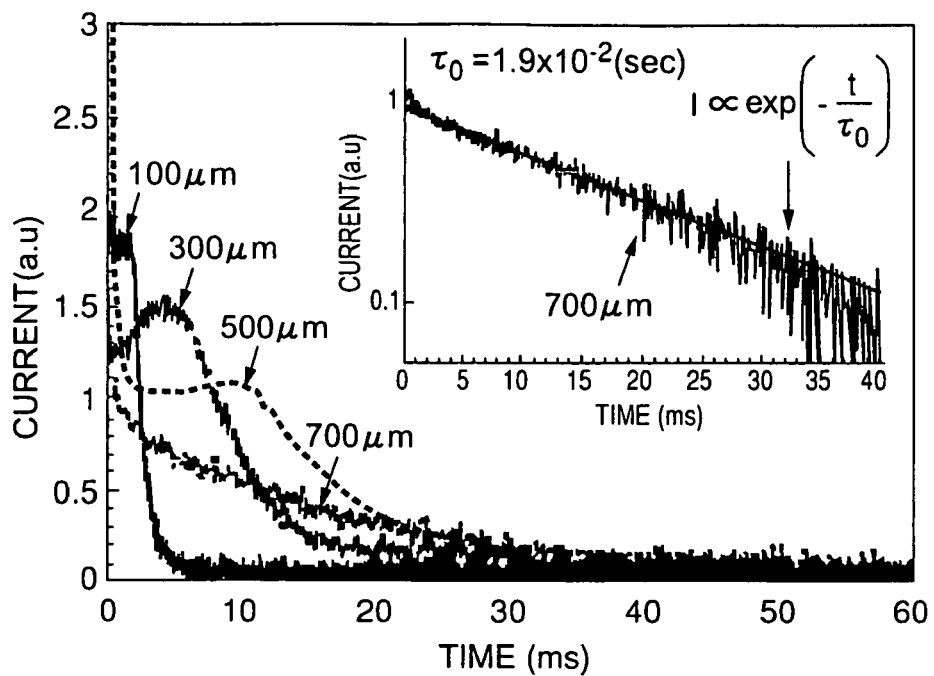
FIG. 6 is a graph showing an example of the results of measurement of positive-charge transient photocurrent waves as a function of the cell thickness under given field strength (results of SmA phase at 110° C.)
Figure 7:
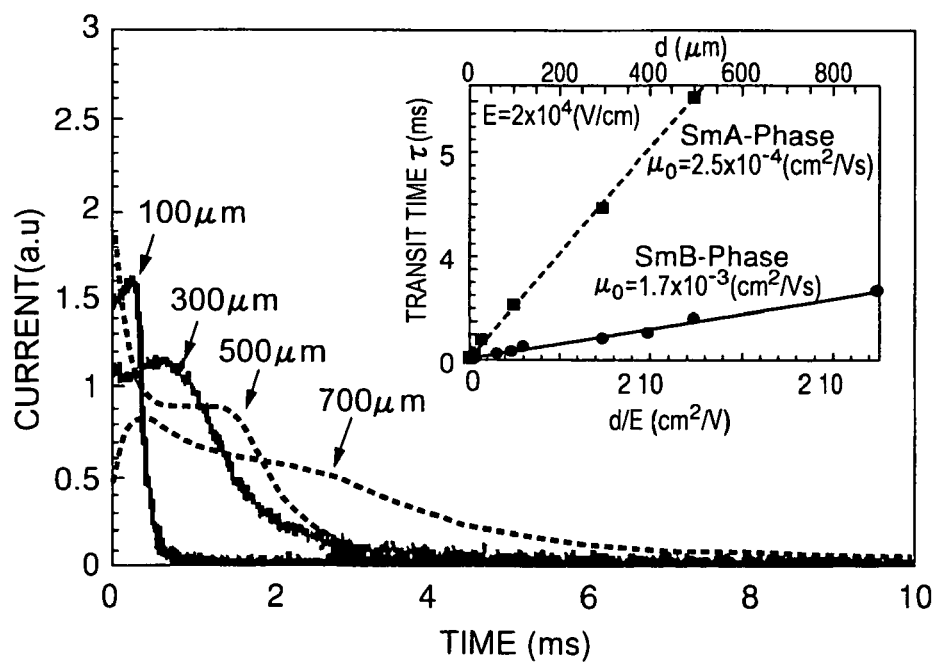
FIG. 7 is a graph showing an example of the results of measurement of positive-charge transient photocurrent waves as a function of the cell thickness under given field strength (results of SmB phase at 90° C.).

FIGS. 6 and 7 are each a graph showing an example of the results of measurement of positive-charge transient photocurrent waves as a function of the cell thickness under given field strength, in the case where 8-PNP-012 represented by formula (I) was used.

For the charge transport of the positive charge, the measurement was carried out with varied cell thicknesses under given field strength and light intensity from the viewpoint of rendering the quantity of photocarrier produced constant. In FIGS. 6 and 7, the field strength was $1.6 \times 10^4$ V/cm for a cell thickness of 700 µm and was $8 \times 10^4$ V/cm for other cell thicknesses. In FIG. 6, all the arrows except for the arrow for the sample of cell thickness 700 µm indicate the transit times for respective samples. FIG. 6 shows the results of the measurement for a SmA phase at 110° C., and FIG. 7 shows the results of a SmB phase at 90° C. The inset in FIG. 6 is a single logarithmic graph of transient photocurrent as a function of transit time of positive charges for samples of the SmA phase as measured in cell thickness 700 µm. The inset in FIG. 7 shows the transit time as a function of d (cell thickness)/E (field strength).

In the SmB phase, as shown in FIG. 7, transit was observed even in a considerably large cell thickness of not less than 700 µm, for example, about 700 to 1000 µm. From this fact, it is considered that the hole lifetime in the SmB phase is not less than $10^{-3}$ sec. On the other hand, in the SmA phase, as shown in FIG. 6, transit can be observed even in a cell thickness of not less than 500 µm, for example, about 500 µm to 700 µm. When the cell thickness exceeds 700 µm, however, any waveform characteristic of hole transit was not observed and, instead, an exponential damping waveform was observed. This is considered to clearly show the disappearance of holes as a result of recombination with a small quantity of electrons which are supplied from the counter electrode, rather than reflection of trapping of holes by the trap or the like. The reason for this believed to reside in that, in a system having lower viscosity than the SmB phase, if holes are trapped by impurities, then ion conduction should be always observed. Based on this, the hole lifetime is $10^{-2}$ sec.

The property time in attenuation, $\tau_0$, with cell thickness 700 µm shown in the inset of FIG. 6 is $2 \times 10^{-2}$ sec which was substantially the same as the above hole lifetime value estimated from the transit.

Analysis conducted while taking into consideration the fluidity of the liquid crystal phase based on the results of the measurement of the transient photocurrent by the TOF method revealed that the hole lifetime is possibly governed by recombination and the recombination lifetime is $10^{-2}$ sec, while the electron lifetime is governed by trapping by impurity molecules and the trapping lifetime is 4 to $6 \times 10^{-5}$ sec.

8-PNP-012 represented by formula (I), that is a liquid crystalline organic semiconductor material which shows the above experimental results, exhibits individual phases at respective temperatures, specifically an isotropic phase at 121° C. or above, a SmA phase having a layer structure at 121 to 99° C., and a SmB phase at 99 to 69° C. The transient photocurrent waveform for each phase measured by the TOF method is nondispersive and exhibits distinct transit, and, for both positive charge and negative charge, the mobility is $10^{-5}$ cm²/Vs for the isotropic phase, $10^{-4}$ cm²/Vs for the SmA phase, and $10^{-3}$ cm²/Vs for the SmB phase.

Many organic semiconductor materials, for example, phenylbenzothiazole derivatives, terthiophene derivatives, and terphenyl derivatives, may be mentioned as materials having carrier lifetimes similar to those obtained by the above experiment.

The organic semiconductor material according to the present invention is a smectic (Sm) liquid crystal phase material, which has both crystalline properties and liquid crystalline properties, and thus is advantageously flowable and can be easily coated by means such as printing or coating. Further, this organic semiconductor material is likely to spontaneously cause molecular orientation by self-organization and thus has a feature of crystal-like orientation.

In the organic semiconductor material according to the present invention which is a rodlike low-molecular weight liquid crystal material, the organic semiconductor layer of the organic semiconductor element may be formed of a higher order smectic phase, which can realize a very high charge mobility of not less than $5 \times 10^{-2}$ cm² V$^{-1}$ s$^{-1}$, and thus is suitable for use in organic semiconductor elements.

The organic semiconductor layer formed of the organic semiconductor material may be formed by aligning the organic semiconductor material according to the present invention which has rodlike low-molecular weight liquid crystallinity. The organic semiconductor material can be aligned by stacking the organic semiconductor material on a liquid crystal aligning layer formed of a polyimide material or by stacking the organic semiconductor material on a liquid crystal aligning layer formed of a curable resin having on its surface fine concaves and convexes.

Since the organic semiconductor material according to the present invention is flowable at or above a temperature at which the liquid crystal state can be maintained, coating can be carried out in this state. According to this method, a large-area organic semiconductor layer having excellent charge mobility characteristics can be very easily formed. In this case, various coating methods and printing methods can be applied for coating.

Examples of organic semiconductor elements, which can be formed of the above organic semiconductor material, include, but are not limited to, transistors, organic ELs, solar cells, and sensors.

What is claimed is:

1. An organic semiconductor device having an organic semiconductor cell structure form which is prepared by holding an organic semiconductor material having rodlike low-molecular weight liquid crystallinity between opposed electrodes, said organic semiconductor material comprising: a core structure comprising L 6 π electronic rings, M 8 π electronic rings, N 10 π electronic rings, O 12 π electronic rings, P 14 π electronic rings, Q 16 π electronic rings, R 18 π electronic rings, S 20 π electronic rings, T 22 π electronic rings, U 24 π electronic rings, and V 26 π electronic rings, wherein L, M, N, O, P, Q, R, S, T, U, and V are each an integer of 0 (zero) to 6 and L+M+N+O+P+Q+R+S+T+U+V=1 to 6; and a terminal structure attached to at least one end of said core structure, said terminal structure being capable of developing liquid crystallinity, said organic semiconductor material having an electron lifetime of at least $4 \times 10^{-5}$ sec and/or a hole lifetime of at least $1 \times 10^{-5}$ sec, and said organic semiconductor cell having a thickness in the range of from 5 μm to 700 μm.

* * * * *